(12) United States Patent
Lee et al.

(10) Patent No.: US 12,032,281 B2
(45) Date of Patent: Jul. 9, 2024

(54) PELLICLE CLEANING APPARATUS AND PELLICLE CLEANING METHOD USING THE SAME

(71) Applicant: SAMSUNG ELECTRONICS CO., LTD., Suwon-si (KR)

(72) Inventors: Byunghoon Lee, Seoul (KR); Jin Goo Park, Ansan-si (KR); Tae-Gon Kim, Ansan-si (KR); Sanguk Park, Yongin-si (KR); Changyoung Jeong, Yongin-si (KR); Jinho Ahn, Seoul (KR); Hyun-tae Kim, Anyang-si (KR)

(73) Assignees: Samsung Electronics Co., Ltd. (KR); INDUSTRY-UNIVERSITY COOPERATION FOUNDATION HANYANG UNIVERSITY ERICA CAMPUS (KR)

( * ) Notice: Subject to any disclaimer, the term of this patent is extended or adjusted under 35 U.S.C. 154(b) by 0 days.

(21) Appl. No.: 17/889,472

(22) Filed: Aug. 17, 2022

(65) Prior Publication Data
US 2023/0205078 A1    Jun. 29, 2023

(30) Foreign Application Priority Data

Dec. 23, 2021    (KR) .......................... 10-2021-0185830

(51) Int. Cl.
*B08B 7/00* (2006.01)
*B08B 11/02* (2006.01)
(Continued)

(52) U.S. Cl.
CPC .............. *G03F 1/82* (2013.01); *B08B 7/0028* (2013.01); *B08B 11/02* (2013.01); *B08B 13/00* (2013.01); *G03F 7/70925* (2013.01)

(58) Field of Classification Search
CPC ..... G03F 1/82; G03F 7/70925; B08B 7/0028; B08B 11/02; B08B 13/00
See application file for complete search history.

(56) References Cited

U.S. PATENT DOCUMENTS 5,601,955 A * 2/1997 Fujita .................... G03F 1/64
 430/5
6,149,992 A * 11/2000 Nakayama ............. G03F 1/64
 430/5
(Continued)

FOREIGN PATENT DOCUMENTS

JP    2007-335665 A    12/2007
JP    2008-226973 A    9/2008
(Continued)

OTHER PUBLICATIONS

KR 10-2021-0150711 (Year: 2021).*
Götzinger et al., "Particle Adhesion Force Distributions on Rough Surfaces," Langmuir, 20, 5298-5303 (2004).

*Primary Examiner* — Alexander Markoff
(74) *Attorney, Agent, or Firm* — Fish & Richardson P.C.

(57) ABSTRACT

A pellicle cleaning apparatus includes a stage to support a pellicle, a particle remover above the stage, the particle remover being configured to remove a particle from a first surface of a pellicle, and the particle remover including a cantilever, and an adhesive material on a bottom surface of the cantilever, and a pressure controller adjacent to the stage, the pressure controller being configured to control a pressure of a fluid on a second surface of the pellicle.

14 Claims, 16 Drawing Sheets

(51) Int. Cl.
    *B08B 13/00*      (2006.01)
    *G03F 1/82*      (2012.01)
    *G03F 7/00*      (2006.01)

(56) References Cited

U.S. PATENT DOCUMENTS

| | | | |
|---|---|---|---|
| 6,715,495 B2 * | 4/2004 | Dao | H01L 21/67366 |
| | | | 134/1 |
| 7,094,505 B2 * | 8/2006 | Zhang | G03F 7/70983 |
| | | | 430/5 |
| 7,153,615 B2 | 12/2006 | Bristol et al. | |
| 8,287,653 B2 * | 10/2012 | Robinson | G03F 7/70925 |
| | | | 15/210.1 |
| 8,696,818 B2 * | 4/2014 | Robinson | B08B 1/00 |
| | | | 134/8 |
| 9,933,699 B2 | 4/2018 | Lee et al. | |
| 10,088,745 B2 | 10/2018 | Nishimura et al. | |
| 10,330,581 B2 * | 6/2019 | Robinson | G03F 7/70925 |
| 10,384,238 B2 * | 8/2019 | Robinson | B08B 1/001 |
| 10,466,585 B2 | 11/2019 | Vles et al. | |
| 2015/0323862 A1 * | 11/2015 | Chang | B08B 7/0021 |
| | | | 134/1.1 |
| 2016/0263632 A1 * | 9/2016 | Robinson | B08B 1/00 |
| 2016/0266165 A1 * | 9/2016 | Robinson | B08B 1/001 |
| 2016/0274471 A1 * | 9/2016 | Lee | G03F 1/84 |

FOREIGN PATENT DOCUMENTS

| | | |
|---|---|---|
| JP | 2009-302234 A | 12/2009 |
| KR | 10-0396378 B1 | 9/2003 |
| KR | 10-2005-0070436 A | 7/2005 |

* cited by examiner

# PELLICLE CLEANING APPARATUS AND PELLICLE CLEANING METHOD USING THE SAME

CROSS-REFERENCE TO RELATED APPLICATION

This U.S. nonprovisional application claims priority under 35 U.S.C. § 119 to Korean Patent Application No. 10-2021-0185830, filed on Dec. 23, 2021, in the Korean Intellectual Property Office, the disclosure of which is hereby incorporated by reference in its entirety.

BACKGROUND

1. Field

Embodiments relate to a pellicle cleaning apparatus and a pellicle cleaning method. More particularly, embodiments relate to a pellicle cleaning apparatus capable of removing particles on a pellicle and a pellicle cleaning method using the same.

2. Description of the Related Art

A semiconductor device may be fabricated through various processes. For example, the semiconductor device may be manufactured by a photolithography process, an etching process, and a deposition process performed on a silicon wafer. In the photolithography process, a photomask may be used to form patterns on a wafer. A fine pattern may be present on the photomask. Such a fine pattern may be vulnerable to contamination. A pellicle may be used to protect the pattern on the photomask.

SUMMARY

According to some embodiments, a pellicle cleaning apparatus may include a particle removal device that removes from one surface of a pellicle a particle on the one surface of the pellicle; and a pressure control device that controls a pressure of fluid on another surface of the pellicle. The particle removal device may include: a cantilever member; and an adhesive material on one side at a bottom surface of the cantilever member.

According to some embodiments, a pellicle cleaning method may include obtaining information about a position of a particle on one surface of a pellicle; placing a particle removal device on the particle; driving the particle removal device on the particle to move toward the one surface of the pellicle; adhering the particle to the particle removal device; and removing from the pellicle the particle removal device to which the particle is adhered. The step of adhering the particle to the particle removal device may include allowing the particle to adhere to an adhesive material of the particle removal device.

According to some embodiments, a pellicle cleaning method may include loading a pellicle on a stage; placing a particle removal device on the pellicle; driving the particle removal device to move on the pellicle; adhering a particle to the particle removal device, the particle on one surface of the pellicle; and removing from the pellicle the particle removal device to which the particle is adhered. The step of adhering the particle to the particle removal device may include allowing the particle to adhere to an adhesive material of the particle removal device.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
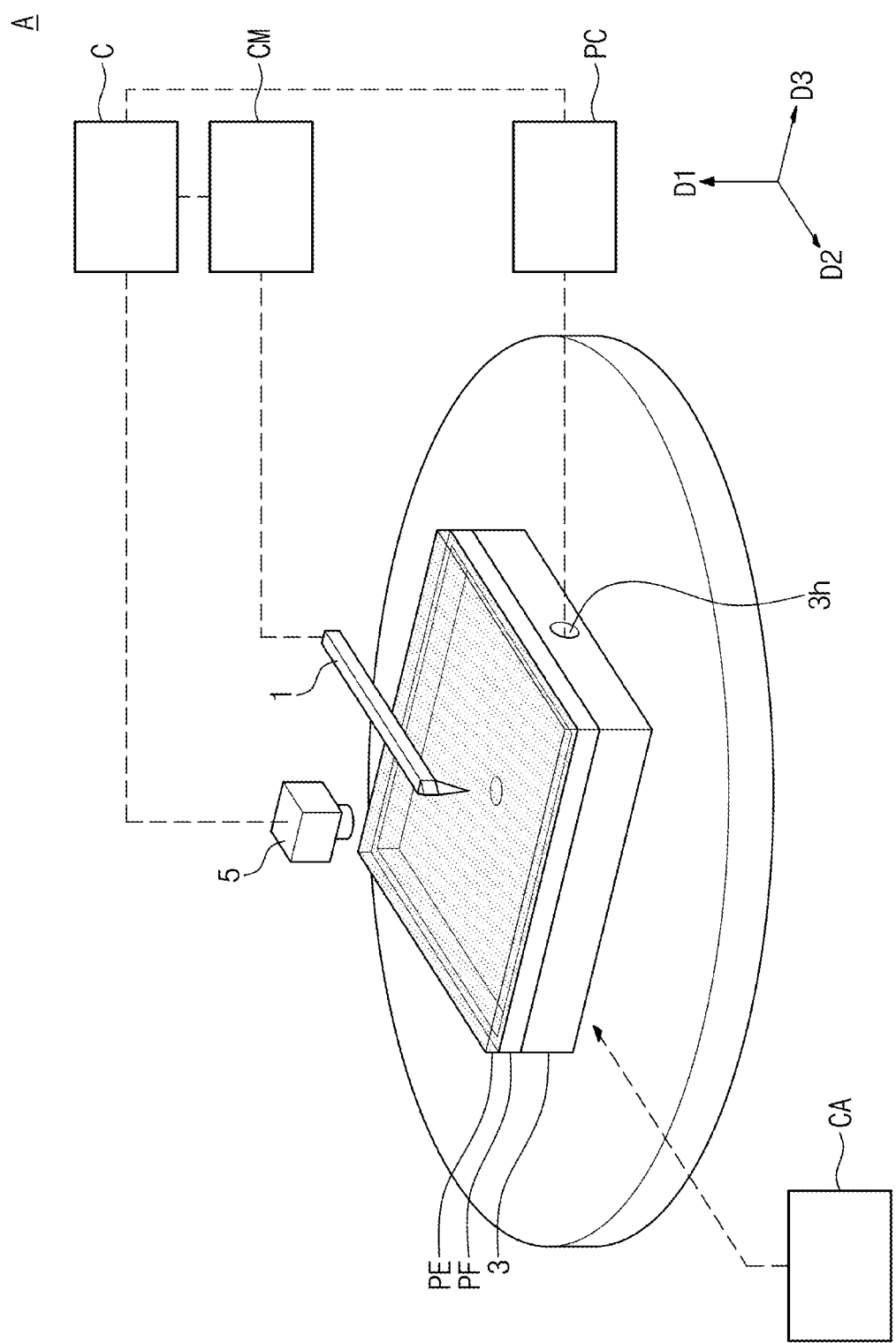
FIG. 1 illustrates a perspective view of a pellicle cleaning apparatus according to some embodiments.

FIG. 1 illustrates a perspective view of a pellicle cleaning apparatus according to some embodiments. In FIG. 1, D1 indicates a first direction, D2 indicates a second direction that intersects the first direction D1, and D3 indicates a third direction that intersects each of the first and second directions D1 and D2.

Referring to FIG. 1, a pellicle cleaning apparatus A may be provided. The pellicle cleaning apparatus A may be a device to remove foreign substances, e.g., particles, from a pellicle.

The pellicle may be a membrane that protects a photomask used in an exposure process in a semiconductor fabrication. For example, the pellicle may be used to protect patterns of a photomask used in an extreme ultraviolet (EUV) light exposure process. For example, the pellicle may protect a mask pattern from contamination, filter contaminants, etc. The pellicle may include various materials. For example, when the pellicle is used for protection of the photomask, the pellicle may include carbon, e.g., at least one of graphite, graphene, carbon nano-tube (CNT), nano-horn, nano carbon flake, nano-crystalline graphite, amorphous carbon, diamond-like carbon (DLC), hydrocarbon, and graphene oxide. In another example, the pellicle may include any suitable materials transparent to EUV wavelengths, e.g., at least one of molybdenum (Mo), ruthenium (Ru), zirconium (Zr), zirconium carbide (ZrC), boron (B), boron carbide ($B_xC_y$), boron nitride (BN), titanium (Ti), tungsten (W), tungsten sulfide ($W_xS_y$), niobium (Nb), aluminum (Al), tin (Sn), zinc (Zn), and nickel (Ni). When the pellicle is used for different purposes, the pellicle may include a material suitable to meet the purposes.

The pellicle cleaning apparatus A may include a configuration to remove foreign substances, e.g., particles, from the pellicle. For example, the pellicle cleaning apparatus A may include a stage 3, a particle removal device 1 (i.e., a particle remover), a capture device 5 (i.e., an imager), a pressure control device PC (i.e., a pressure controller), a removal drive mechanism CM (i.e., a driver), and a controller C.

The stage 3 may support a pellicle PE. For example, the stage 3 may support the pellicle PE coupled onto a pellicle frame PF, e.g., the pellicle frame PF may be between the stage 3 and the pellicle PE. The pellicle PE may have a thickness ranging from about 30 nm to about 120 nm, e.g., along the first direction D1. The pellicle frame PF may be a member connected to a photomask. For example, the pellicle PE together with the pellicle frame PF may be cleaned while being removed from the photomask. In another example, the pellicle PE may be cleaned while the pellicle frame PF fixes the pellicle PE to the photomask. A detailed description thereof will be further discussed below. The stage 3 may be connected to the pressure control device PC. The pressure control device PC may control vibration of the pellicle PE disposed on the stage 3.

The particle removal device 1 may remove particles positioned on one surface of the pellicle PE. The particle removal device 1 may include a cantilever structure. The removal drive mechanism CM may drive the particle removal device 1 to move in a horizontal direction and/or a vertical direction, e.g., the cantilever structure of the particle removal device 1 may be, e.g., detachably, attached to the removal drive mechanism CM positioned adjacent to the stage 3.

The capture device 5 may capture one surface of the pellicle PE. For example, the capture device 5, e.g., an optical inspection device, may be an imaging device that captures an image of one surface of the pellicle PE. The capture device 5 may be disposed on, e.g., above, one surface of the pellicle PE. The capture device 5 may include various configurations to obtain a visual image. For example, the capture device 5 may include an image sensor. The capture device 5 may be connected to the controller C. The capture device 5 may obtain information about one surface of the pellicle PE, and the controller C may receive the obtained information.

The pressure control device PC may control vibration of the pellicle PE. For example, the pressure control device PC may control a fluid pressure in a space adjacent to the pellicle PE disposed on the stage 3, thereby controlling vibration of the pellicle PE. The pressure control device PC may include, e.g., one or more of a compressor, a vacuum pump, a pipe, and a motor. The pressure control device PC may be connected to the stage 3. For example, the pressure control device PC may be connected to a pressure delivery hole 3h of the stage 3. A detailed description thereof will be further discussed below.

The removal drive mechanism CM may move the particle removal device 1. For example, the removal drive mechanism CM may drive the particle removal device 1 to move in a horizontal direction (e.g., in parallel to an upper surface of the pellicle PE) and/or a vertical direction (e.g., perpendicularly to the upper surface of the pellicle PE). The removal drive mechanism CM may include an actuator, e.g., an electrical motor or a hydraulic motor.

The controller C may control the capture device 5, the removal drive mechanism CM, and the pressure control device PC. The controller C may be implemented in the form of a computer-readable record media. The computer-readable record media may include all kinds of record media that store instructions that can be interpreted by a computer. For example, the record media may include a volatile memory device, e.g., a static random access memory (SRAM), a dynamic random access memory (DRAM), and/or a synchronous dynamic random access memory (SDRA), or a non-volatile memory device, e.g., a read-only memory (ROM), a programmable read-only memory (PROM), an electrically programmable read-only memory (EPROM), an electrically erasable and programmable read-only memory (EEPROM), a flash memory, a phase change random access memory (PRAM), a magnetic random access memory (MRAM), a resistive random access memory (RRAM), and/or a ferroelectric random access memory (FRAM).

Figure 2:
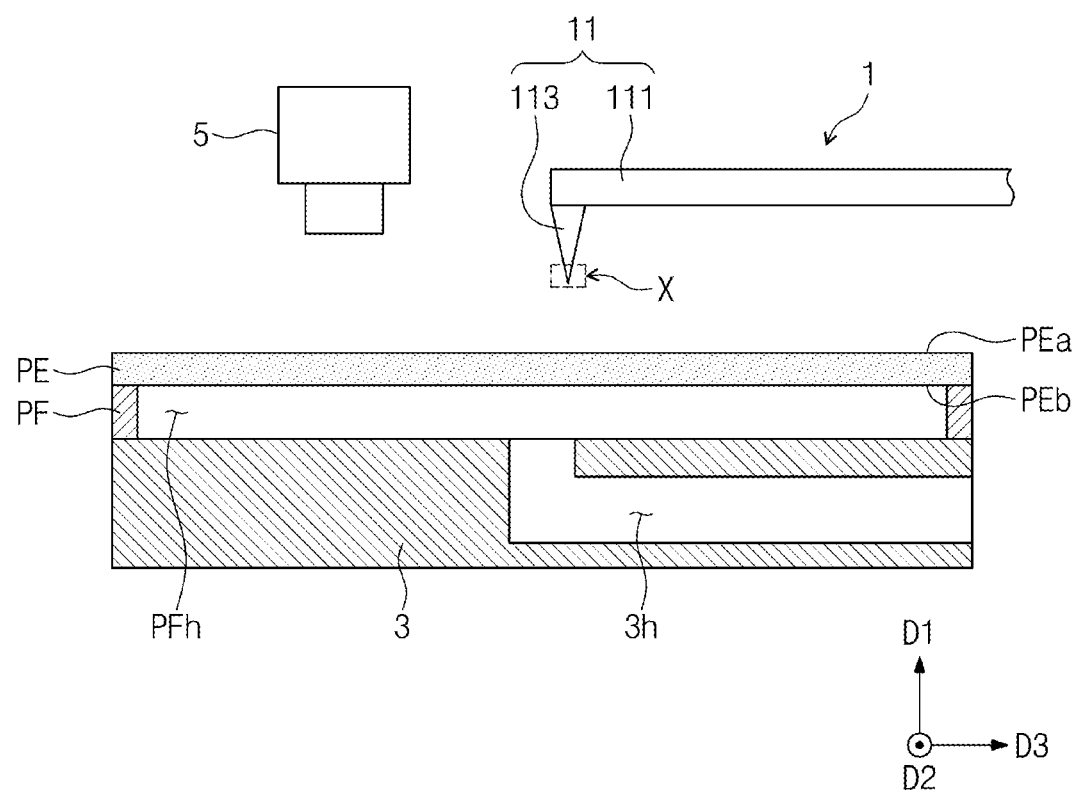
FIG. 2 illustrates a cross-sectional view of a pellicle cleaning apparatus according to some embodiments.
Figure 3:
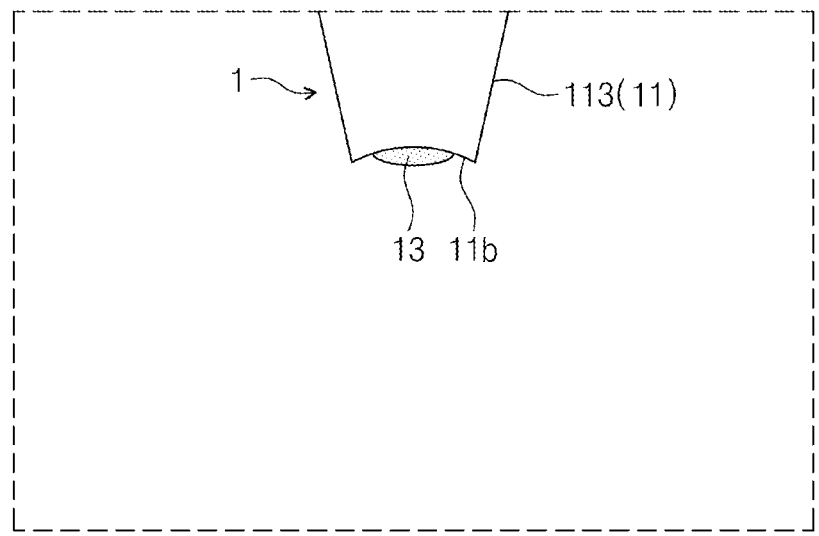
FIG. 3 illustrates an enlarged cross-sectional view of section X of FIG. 2.

FIG. 2 illustrates an enlarged cross-sectional view of the pellicle cleaning apparatus A. FIG. 3 illustrates an enlarged cross-sectional view of section X of FIG. 2. Referring to FIG. 2, the stage 3 may include the pressure delivery hole 3h. The pressure delivery hole 3h may be spatially connected to a space on the stage 3. In addition, as illustrated in FIG. 1, the pressure delivery hole 3h may be connected to the pressure control device PC. Therefore, the pressure control device PC may be connected through the pressure delivery hole 3h to a space on the stage 3.

The pellicle frame PF may provide a frame space PFh. The pellicle frame PF may define the frame space PFh on a central portion thereof, e.g., the frame space PFh may extend from the top surface to the bottom surface of the pellicle frame PF to have a same thickness as the pellicle frame PF in the first direction D1. When the pellicle frame PF is disposed on the stage 3, the frame space PFh may be spatially connected to, e.g., in fluid communication with, the pressure delivery hole 3h.

The pellicle PE may have a first surface PEa directed upwardly. The pellicle PE may have a second surface PEb directed downwardly. When the pellicle PE is disposed on the stage 3, the second surface PEb of the pellicle PE may face the pressure delivery hole 3h. For example, the second surface PEb of the pellicle PE may be exposed to the frame space PFh and the pressure delivery hole 3h.

Referring to FIGS. 2 and 3, the particle removal device 1 may include a cantilever member 11 (i.e., a cantilever) and an adhesive material 13. For example, referring to FIG. 3, the adhesive material 13 may be an adhesive layer on a bottom surface of the cantilever member 11.

In detail, referring to FIG. 2, the cantilever member 11 may include a support member 111 and a tip 113. The support member 111 may have a linear shape, e.g., a rod shape, that extends in a horizontal direction, e.g., along the third direction D3. For example, as illustrated in FIG. 2, the support member 111 may extend above, e.g., to overlap, and in parallel to a top surface of the stage 3. The support member 111 may be connected to the removal drive mechanism CM, as illustrated in FIG. 1. The support member 111 may support the tip 113 and the adhesive material 13.

The tip 113 may be connected to the support member 111. For example, the tip 113 may be connected to an end portion of the support member 111, e.g., the removal drive mechanism CM and the tip 113 may be at opposite ends of the support member 111 along the third direction D3. The tip 113 may extend a certain length from the support member 111, e.g., the tip 113 may extend from a bottom of the support member 111 toward the pellicle PE along the first direction D1. For example, the tip 113 may have a shape that tapers downwardly, e.g., the tip 113 may have an inverted truncated-triangular cross-section. As illustrated in FIG. 3, a bottom surface of the tip 113 may include an adhesive surface 11b, e.g., a surface of the tip 113 facing away from the support member 111 may include the adhesive surface 11b. The adhesive surface 11b may have a curved shape that is recessed toward the support member 111, e.g., the adhesive surface 11b may be concave with respect to the center of the tip 113.

The adhesive material 13 may be positioned on one side at a bottom surface of the cantilever member 11. For example, the adhesive material 13 may be positioned on the bottom surface of the tip 113, e.g., the adhesive material 13 may be positioned on the adhesive surface 11b of the tip 113. The adhesive material 13 may include a material to which particles on the pellicle PE are adhered. The adhesive material 13 may include a material having the property of bonding to particles, such that particles on the pellicle PE are separated from the pellicles PE when contacted by the adhesive material 13. For example, the adhesive material 13 may include silicon-based rubber, e.g., the adhesive material 13 may include polydimethylsiloxane (PDMS). In another example, the adhesive material 13 may include a pressure sensitive adhesive (PSA).

The adhesive material 13 may be coated on one side at the bottom surface of the cantilever member 11. For example, the adhesive material 13 may be coated on the adhesive surface 11b by using dipping, coating, or spraying. An adhesive material supply nozzle may be further provided to coat the adhesive material 13 on the adhesive surface 11b.

The adhesive material 13 may be cured while being coated on the adhesive surface 11b. A curing apparatus may be provided to cure the adhesive material 13 on the adhesive surface 11b.

For example, the adhesive material 13 may be cured by a laser having a specific wavelength range that corresponds to that of an extreme ultraviolet radiation. In this case, a UV curing apparatus may be provided to cure the adhesive material 13. In another example, the adhesive material 13 may be cured by a curing reaction that uses heat. In this case, the adhesive material 13 may be heated while being coated on the adhesive surface 11b, and the cured adhesive material 13 may be bonded to the cantilever member 11. In this case, a thermal curing apparatus may be provided to cure the adhesive material 13. In yet another example, the adhesive material 13 may be cured by a chemical reaction. In this case, a chemical may be sprayed while the adhesive material 13 is coated on the adhesive surface 11b, and the cured adhesive material 13 may be bonded to the cantilever member 11. In this case, a chemical spray apparatus may be provided to spray the chemical onto the adhesive material 13.

For example, as illustrated in FIG. 1, the pellicle cleaning apparatus A may be an independent device. That is, the pellicle cleaning apparatus A may be a separate constituent positioned outside or inside the exposure apparatus. In another example, the pellicle cleaning apparatus A may be a portion of the exposure apparatus, e.g., the pellicle cleaning apparatus A may be modularized and coupled within the exposure apparatus. The pellicle cleaning apparatus A may clean a pellicle used in an exposure process within the exposure apparatus. In this case, the pellicle may undergo a cleaning process, e.g., a dry cleaning process, inside the exposure apparatus without a requirement of unloading the pellicle and/or a mask from the exposure apparatus. Therefore, it may be possible to prevent contamination that occurs during unloading of the pellicle and/or the mask from the exposure apparatus. In addition, as the pellicle is cleaned within the exposure apparatus, it may be possible to save time required for the cleaning process. Accordingly, a total processing time of the exposure process may be reduced.

Figure 4:
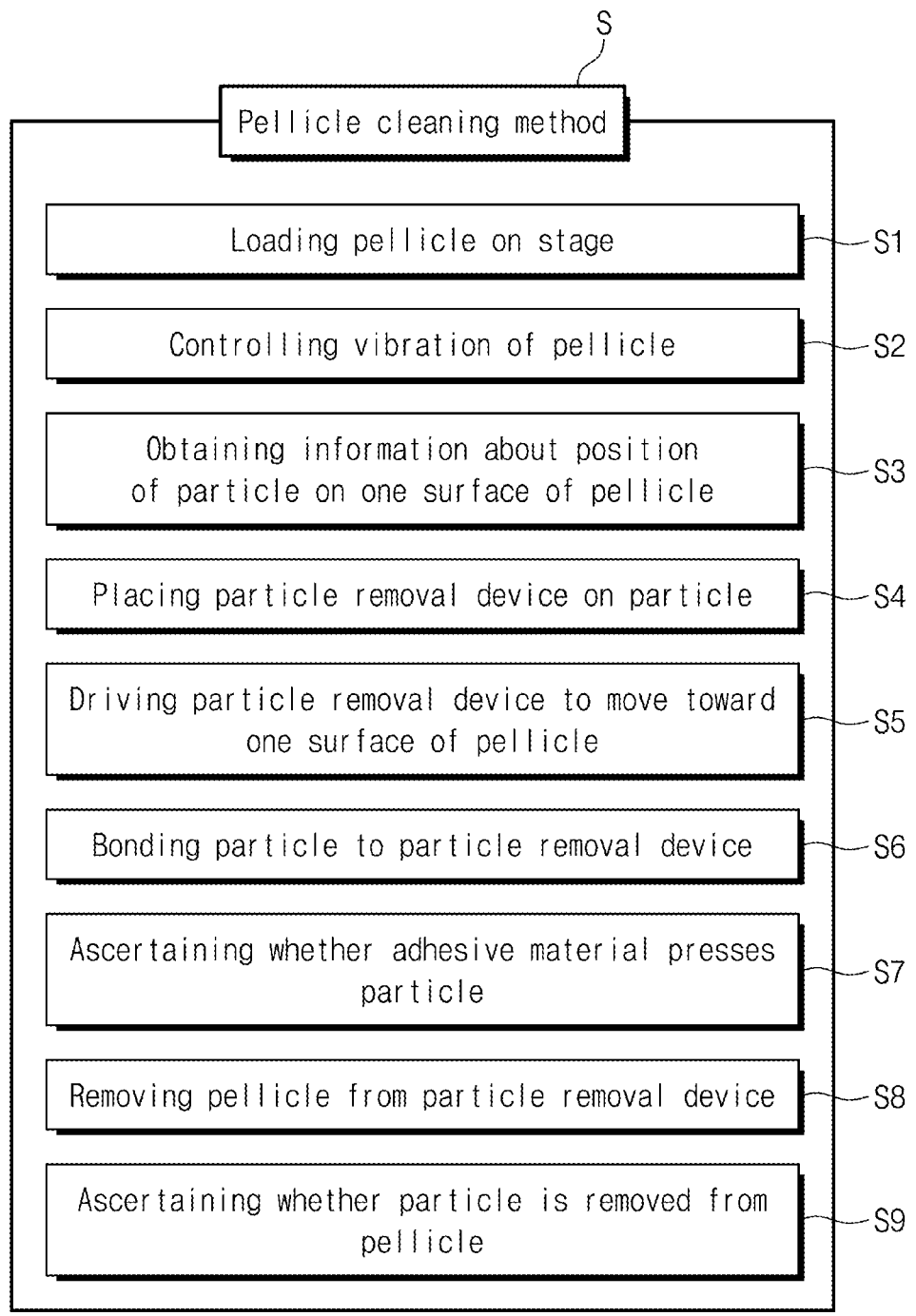
FIG. 4 illustrates a flow chart of a pellicle cleaning method according to some embodiments.

FIG. 4 illustrates a flow chart showing a pellicle cleaning method according to some embodiments.

Referring to FIG. 4, a pellicle cleaning method S may be provided. The pellicle cleaning method S may be a method to remove particles from a pellicle by using the pellicle cleaning apparatus A discussed with reference to FIGS. 1 to 3.

As illustrated in FIG. 4, the pellicle cleaning method S may include loading a pellicle on a stage (operation S1), controlling vibration of the pellicle (operation S2), obtaining information about positions of particles on one surface of the pellicle (operation S3), placing a particle removal device on, e.g., above, the particles (operation S4), driving the particle removal device to move toward the one surface of the pellicle (operation S5), bonding the particles to the particle removal device (operation S6), ascertaining whether an adhesive material presses the particles (operation S7), removing the particle removal device from the pellicle (operation S8), and ascertaining whether the particles are removed from the pellicle (operation S9).

With reference to FIGS. 5 to 12, the following will describe stages in the pellicle cleaning method S depicted in FIG. 4. FIGS. 5 to 12 illustrate diagrams of the pellicle cleaning method S.

Figure 5:
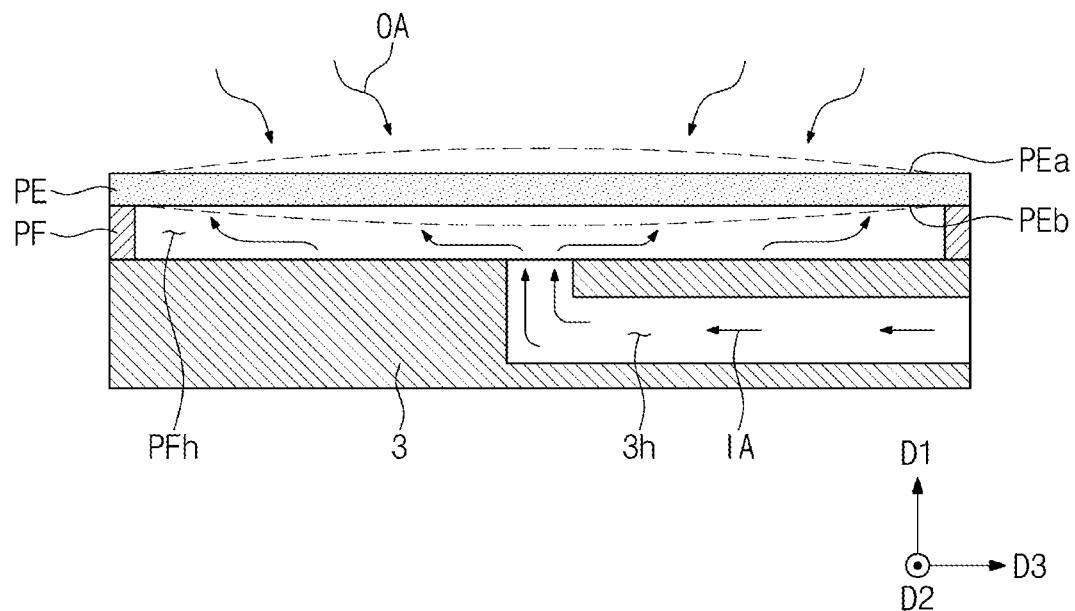
FIGS. 5 to 12 illustrate diagrams of a pellicle cleaning method according to the flow chart of FIG. 4.

Referring to FIGS. 4 and 5, the pellicle PE may be loaded, e.g., placed, on the stage 3 (i.e., operation S1). The pellicle PE may be disposed on the stage 3, while being coupled to the pellicle frame PF. In some embodiments, the pellicle PE may be located on the stage 3, while being separated from a photomask. Embodiments, however, are not limited thereto, e.g., the pellicle PE may be disposed on the stage 3, while being coupled to the photomask. A detailed description thereof will be further discussed below with reference to FIG. 19.

The vibration control (i.e., operation S2) may include controlling vibration of the pellicle PE on the stage 3. The pressure control device PC (FIG. 1) may control vibration of the pellicle PE. For example, a pressure of fluid on the second surface PEb of the pellicle PE may be adjusted through the pressure delivery hole 3h. An inner air current IA provided from the pressure control device PC may flow through the pressure delivery hole 3h to the frame space PFh, thereby removing vibration of the pellicle PE. For example, the inner air current IA may be controlled even with an outer air current OA that is a stream of fluid positioned in a space above the first surface PEa of the pellicle PE. Accordingly, vibration of the pellicle PE may disappear, and the pellicle PE may spread flat.

Figure 6:
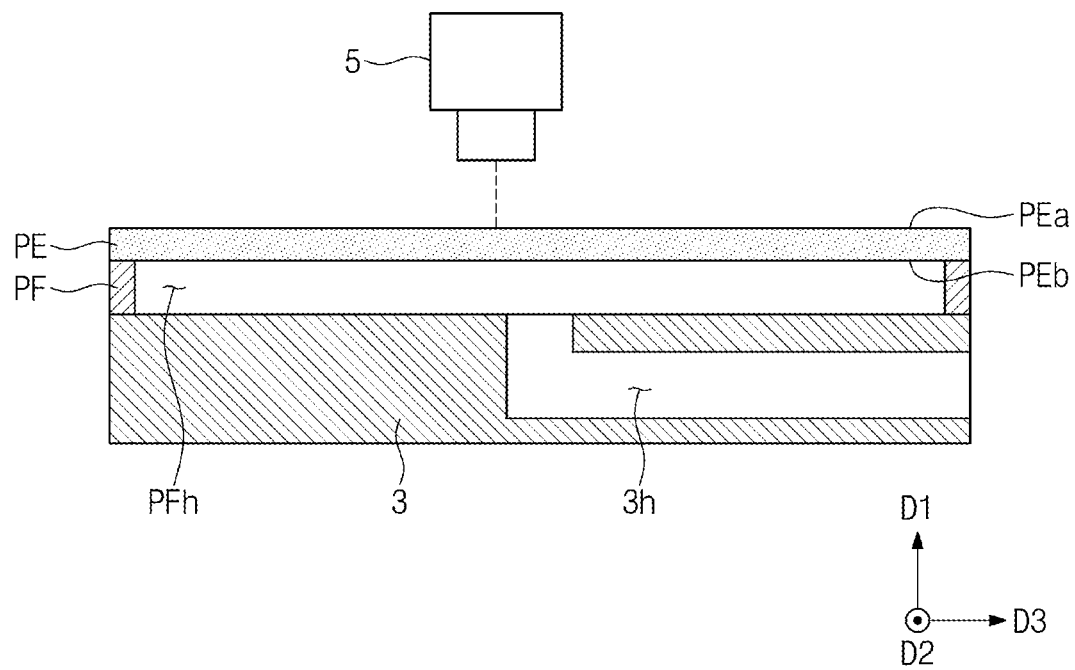
Figure 7:
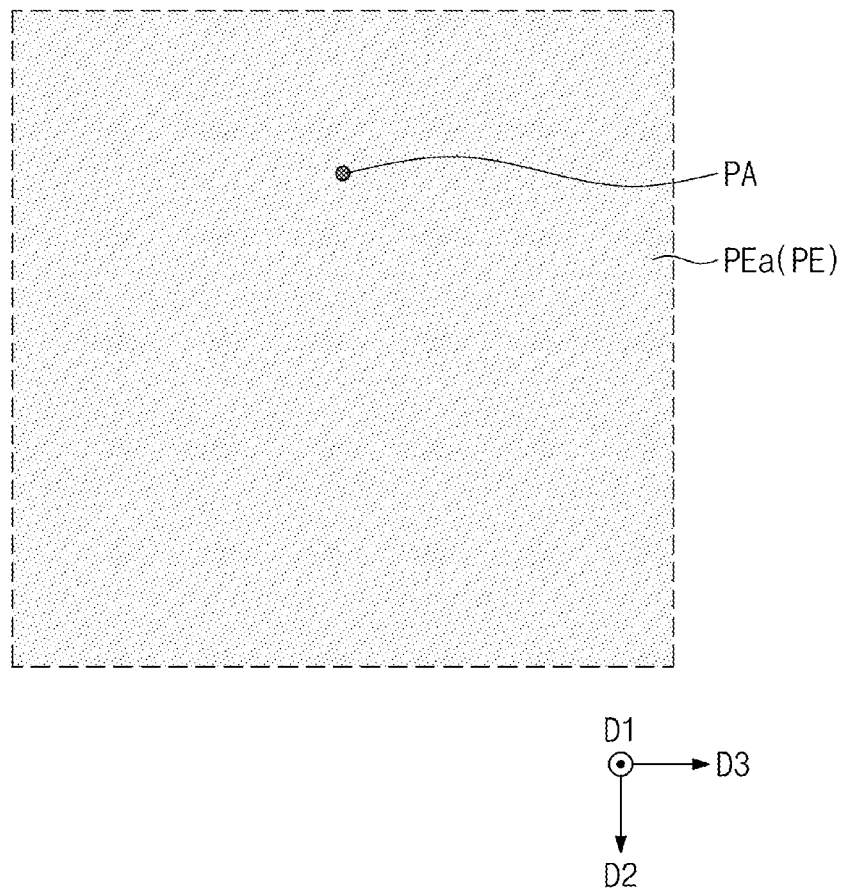

Referring to FIGS. 4, 6, and 7, the particle information obtaining (i.e., operation S3) may include using the capture device 5 to detect a position of a particle PA. For example, the capture device 5 may be used to capture an image of the first surface PEa of the pellicle PE to obtain image information about the first surface PEa. The controller C (FIG. 1) may obtain information about the position of the particle PA from the image information about the first surface PEa. The particle PA removed by the pellicle cleaning apparatus A (FIG. 1) may mean a particle whose size is equal to or greater than a certain value. For example, the particle PA removed by the pellicle cleaning apparatus A may be a particle whose diameter is equal to or greater than about 5 μm, e.g., a particle having a diameter that is equal to or greater than about 10 μm.

Figure 8:
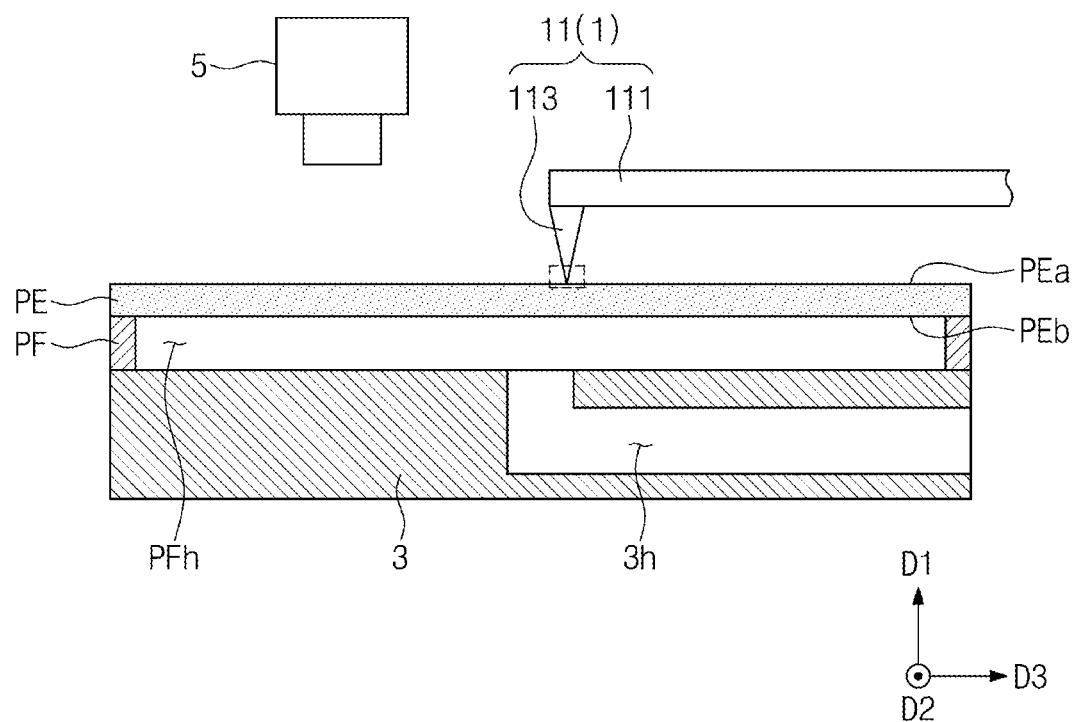
Figure 9:
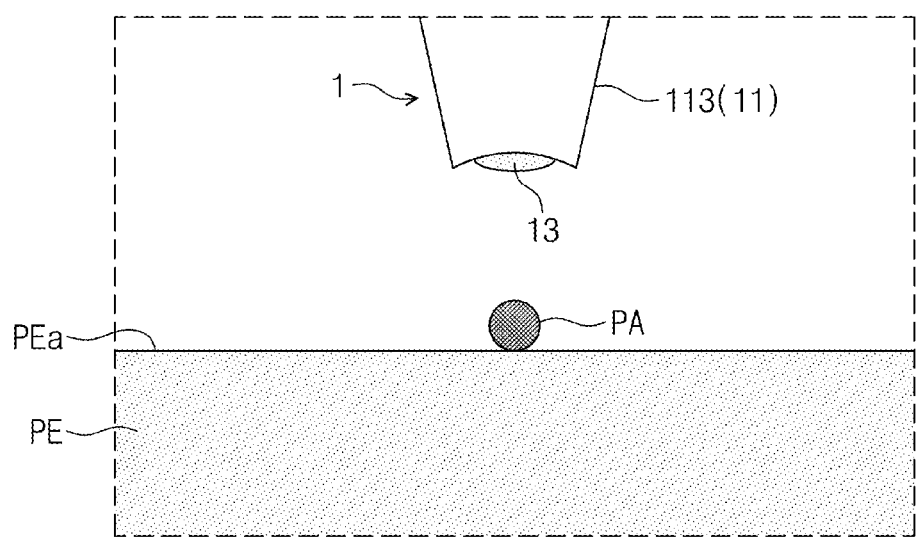

Referring to FIGS. 4, 8, and 9, the device placement (i.e., operation S4) may include allowing the removal drive mechanism CM (FIG. 1) to drive the particle removal device 1 to move above the particle PA. For example, the removal drive mechanism CM may drive the particle removal device 1 to move above, e.g., over, the particle PA, in accordance with the image information obtained about positions of particles PA on the first surface PEa in operation S3. The particle removal device 1 may be controlled to have a position that is upwardly spaced apart at a certain interval, e.g., along the first direction D1, from the particle PA.

Figure 10A:
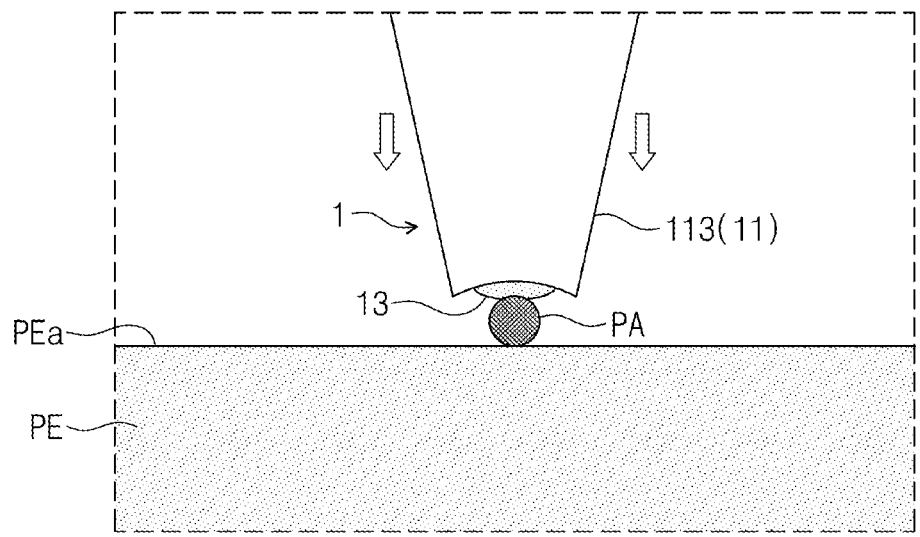

Referring to FIGS. 4 and 10A, the device movement (i.e., operation S5) may include allowing the particle removal device 1 to approach the first surface PEa of the pellicle PE. For example, the particle removal device 1 may descend toward the first surface PEa.

The particle bonding (i.e., operation S6) may include allowing the particle removal device 1 to descend to bond the particle PA to the adhesive material 13. For example, referring to FIG. 10A, the tip 113 of the particle removal device 1 may be lowered toward the pellicle PE, e.g., without the tip 113 directly touching the first surface PEa of the pellicle PE, such that the adhesive material 13 extending from the tip 113 may directly contact the particle PA. In this process, the adhesive material 13 may press the particle PA, e.g., the adhesive material 13 may be pushed against the particle PA by the tip 113. For example, a downward force may be applied to the particle PA. An attractive force between the adhesive material 13 and the particle PA may attach the particle PA to the adhesive material 13.

Figure 10B:
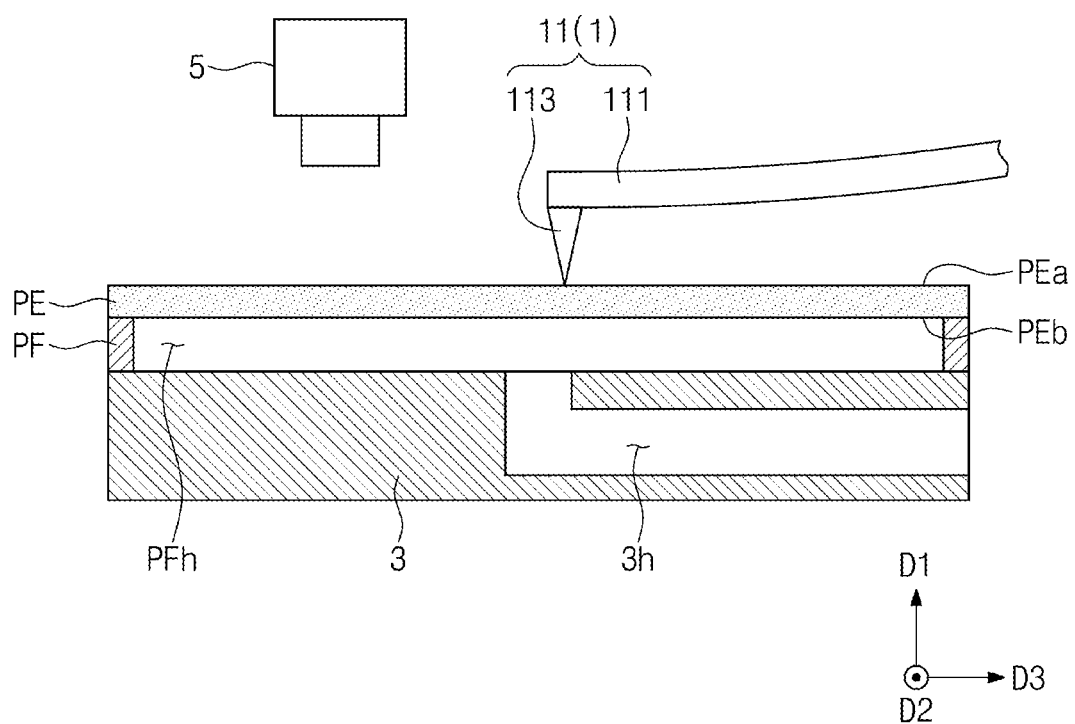

Referring to FIGS. 4 and 10B, the pressing ascertainment (i.e., operation S7) may include observing the particle removal device 1 to ascertain whether the pressing occurs or not. For example, the pressing may be ascertained by observing shape deformation of the cantilever member 11. For more detail, the pressing may be ascertained by determining whether the support member 111 is bent or not. For example, the step may be performed by the capture device 5.

Figure 11:
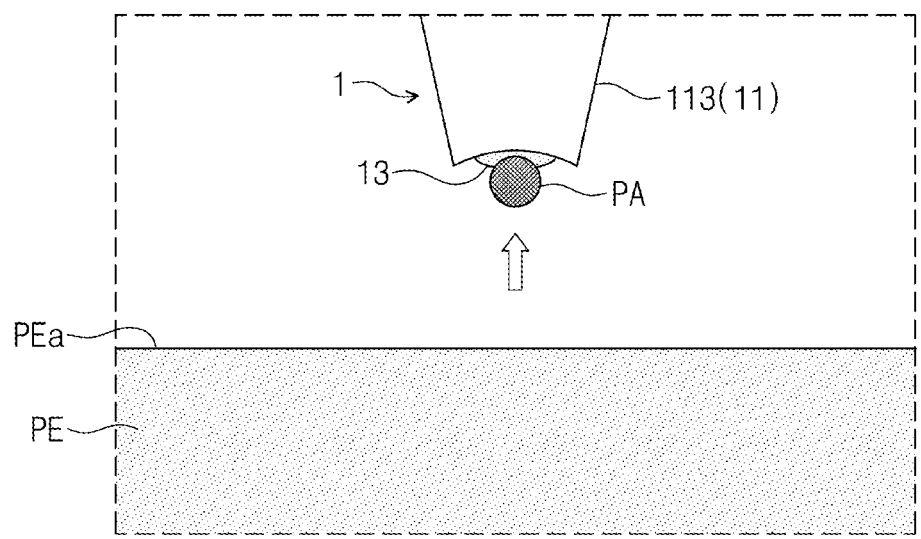

Referring to FIGS. 4 and 11, the device removal (i.e., operation S8) may include raising, form the pellicle PE, the particle removal device 1 to which the particle PA is adhered. In other words, the particle removal device 1 may be lifted away from the pellicle PE while holding the particle PA. The particle removal device 1 may be removed from the pellicle PE, which particle removal device 1 is provided in a state where the particle PA is adhered to the adhesive material 13. The particle removal device 1 may be discarded. For example, the particle removal device 1 may be detached from the removal drive mechanism CM, and a new particle removal device 1 may be attached. The particle removal device 1 may be a one-time use component that is detachably attached to the removal drive mechanism CM. Embodiments, however, are not limited thereto, e.g., the particle PA may be removed from the particle removal device 1 and thus the particle removal device 1 may be reusable.

Figure 12:
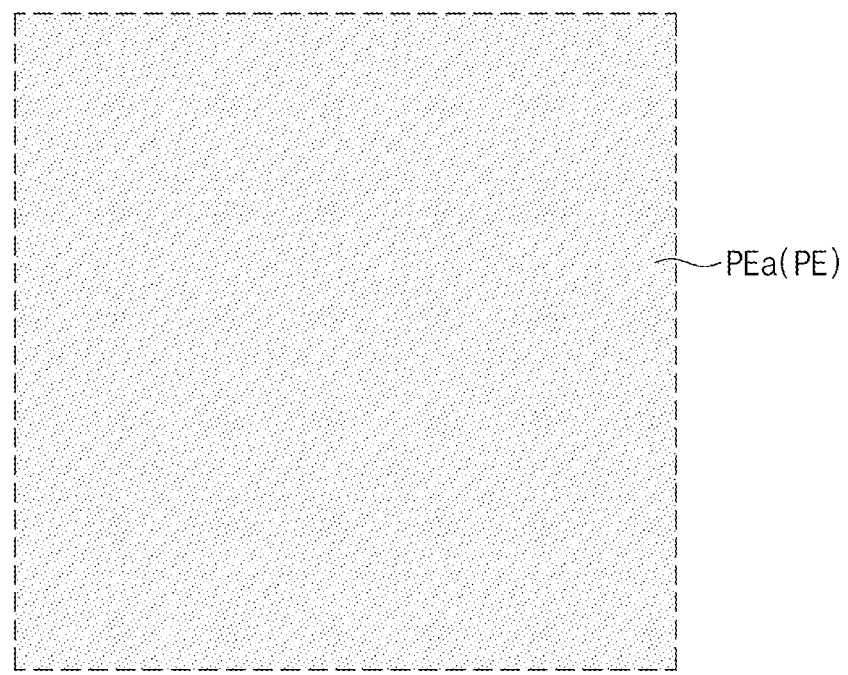
Figure 12:
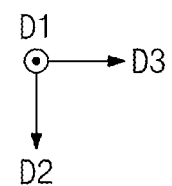

Referring to FIGS. 4 and 12, the removal ascertainment (i.e., operation S9) may include ascertaining the removal of the particle PA from the first surface PEa of the pellicle PE by using image information obtained when the capture device 5 recaptures an image of the first surface PEa of the pellicle PE. When the particle PA is not removed as a result of the ascertainment, i.e., when the image information obtained from the capture device 5 indicates that the particle PA has not been removed, operations S4 through S9 may be repeated.

In some embodiments, a componential analyzer CA may further be provided to analyze a component of the particle PA. For example, the pellicle cleaning apparatus A may further include the componential analyzer CA. The componential analyzer CA may be disposed around the stage 3. For example, the componential analyzer CA may be laterally spaced apart from the stage 3. The componential analyzer CA may analyze the component of the particle PA. For example, the componential analyzer CA may analyze the component of the particle PA removed by the particle removal device 1 from the pellicle PE. When the particle removal device 1 from the pellicle PE places the particle PA on the componential analyzer, the componential analyzer CA may analyze the component of the particle PA. In this case, the pellicle cleaning method S may further include analyzing the component of the particle PA.

The componential analyzer may include a configuration to analyze the component of the particle PA. For example, the componential analyzer may include an energy dispersive spectrometry (EDS). In another example, the componential analyzer may include an ion chromatography (IC) or an inductively coupled plasma mass spectrometer (ICP-MS). Embodiments, however, are not limited thereto, e.g., the componential analyzer may use a fluorescence imaging to analyze the component of the particle PA. A source of the particle PA may be determined based on information about the particle component that is analyzed by the componential analyzer. For example, the pellicle cleaning method S may further include determining an occurrence position of the particle PA. When the occurrence position of the particle PA is determined, one or more of a process and an apparatus may reduce the occurrence of the particle PA. Therefore, contamination of the pellicle PE may be prevented or substantially reduced.

According to a pellicle cleaning apparatus and a pellicle cleaning method using the same in accordance with some embodiments, particles may be targeted and removed from a pellicle. Therefore, it may be possible to increase accuracy and yield of fabrication by removing, from the pellicle, particles whose size is large enough to disturb an exposure process. In addition, a contaminated pellicle may be cleaned and reused to increase a lifespan of the pellicle.

According to a pellicle cleaning apparatus and a pellicle cleaning method using the same in accordance with some embodiments, a pressure control device may be used to control vibration of the pellicle. Accordingly, the pellicle may be prevented from its vibration in the procedure of picking up a fine pellicle.

For convenience of description below, omission will be made to avoid repetitive explanations of contents substantially the same as or similar to those discussed with reference to FIGS. 1 to 12.

Figure 13:
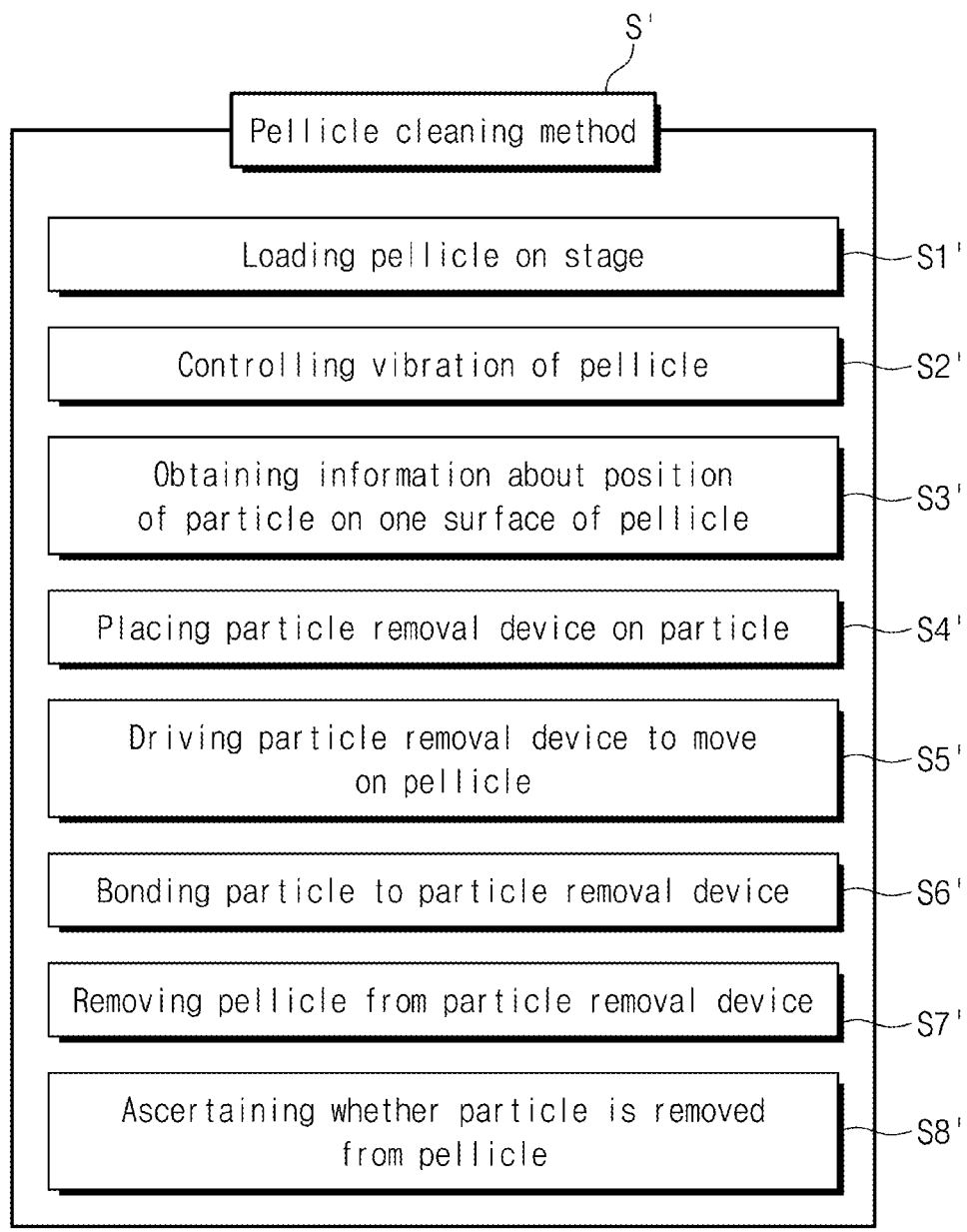
FIG. 13 illustrates a flow chart of a pellicle cleaning method according to some embodiments.

FIG. 13 illustrates a flow chart of a pellicle cleaning method according to some embodiments.

Referring to FIG. 13, a pellicle cleaning method S' may be provided. The pellicle cleaning method S' may be a method to remove particles on a pellicle by using the pellicle cleaning apparatus A discussed with reference to FIGS. 1 to 3.

The pellicle cleaning method S' may include loading a pellicle on a stage (operation S1'), controlling vibration of the pellicle (operation S2'), obtaining information about a position of particles on one surface of the pellicle (operation S3'), placing a particle removal device above the particles (operation S4'), allowing the particle removal device to move above the pellicle (operation S5'), bonding the particles to the particle removal device (operation S6'), removing the particle removal device from the pellicle (operation S7'), and ascertaining whether the particles are removed from the pellicle (operation S8').

With reference to FIGS. 14 to 18, the following will, e.g., sequentially, describe the steps of the pellicle cleaning method S' depicted in FIG. 13. FIGS. 14 to 18 illustrate diagrams showing the pellicle cleaning method S'.

Figure 14:
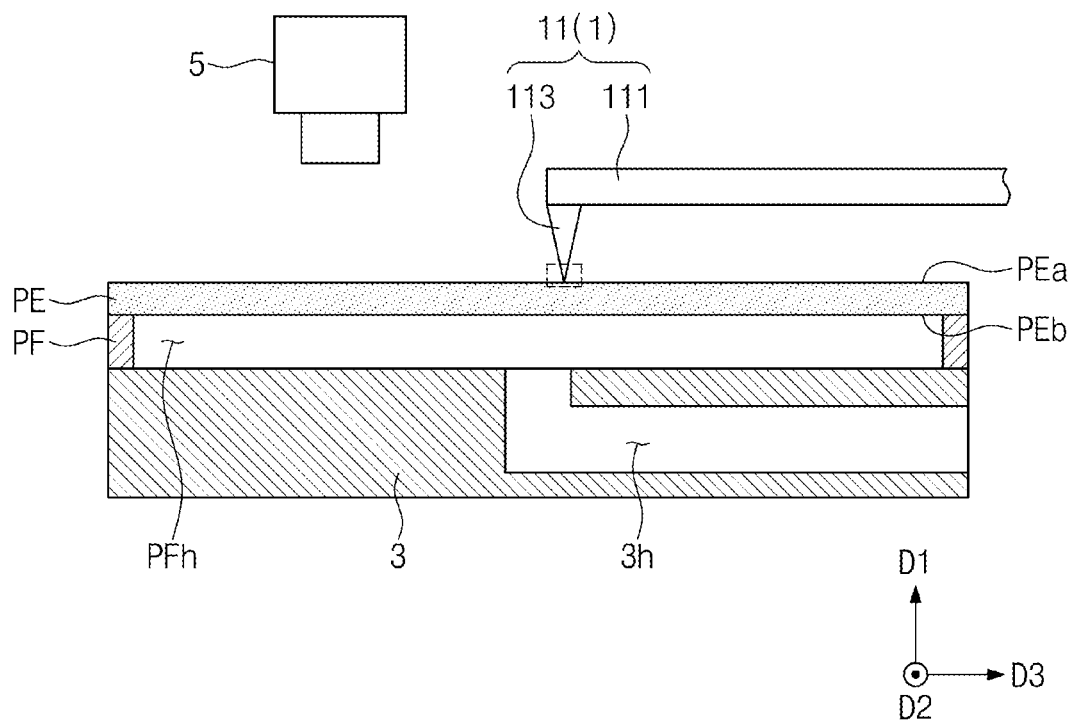
FIGS. 14 to 18 illustrate diagrams of a pellicle cleaning method according to the flow chart of FIG. 13.
Figure 15:
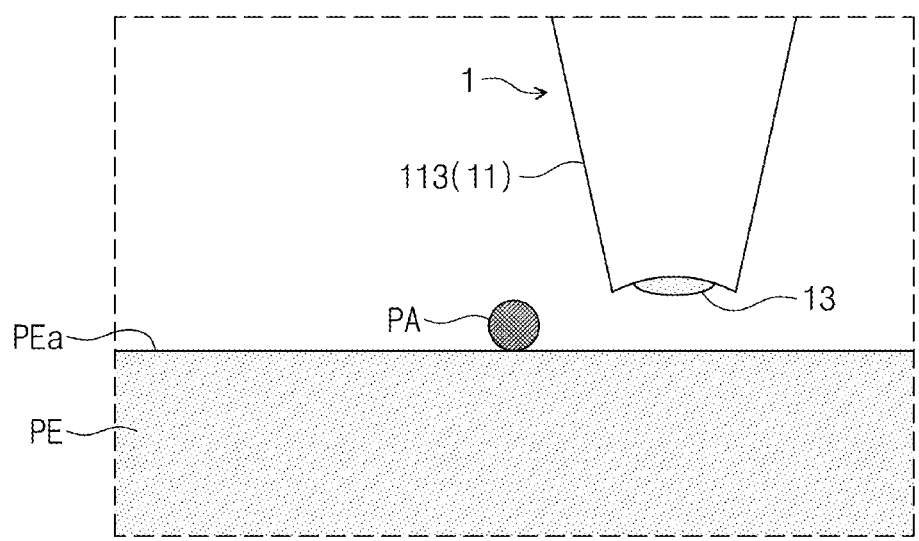

Referring to FIGS. 13, 14, and 15, operations S1' to S3' may be the same as operation S1 to S3', described above. Next, the device placement (i.e., operation S4') may include placing the particle removal device 1 above the first surface PEa of the pellicle PE. The particle removal device 1 may be disposed to allow the adhesive material 13 to be at a height close to that of a top side of the particle PA.

Figure 16:
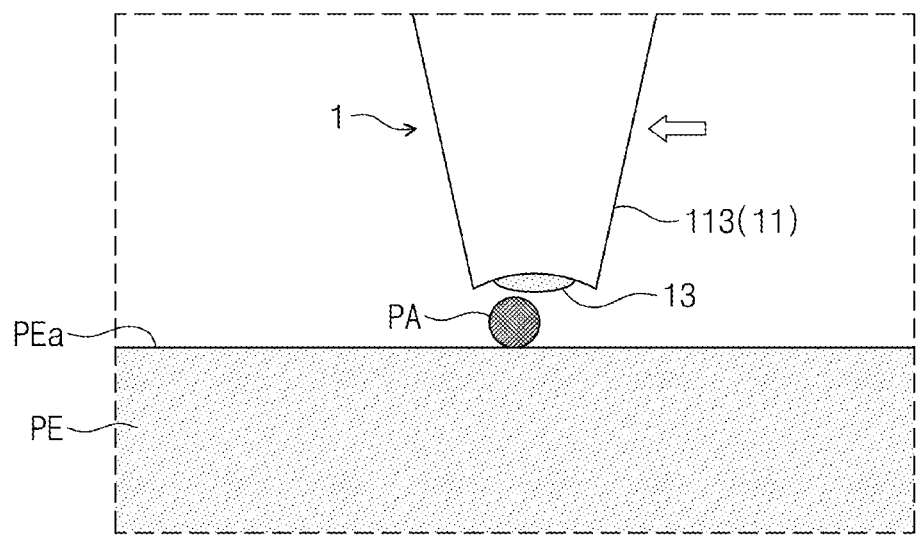

Referring to FIG. 16, the device movement (i.e., operation S5') may include allowing the particle removal device 1 to move in a horizontal direction around the particle PA. In this step, the particle removal device 1 may not move vertically. The particle removal device 1 may move in a horizontal direction so as to allow the adhesive material 13 to be at a height at which the adhesive material 13 interacts by an attractive force with the particle PA.

Figure 17:
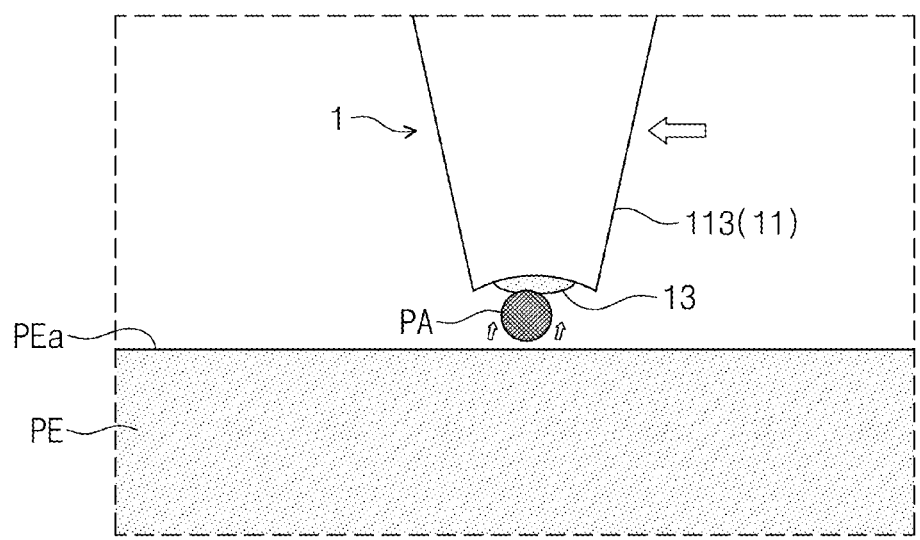
Figure 18:
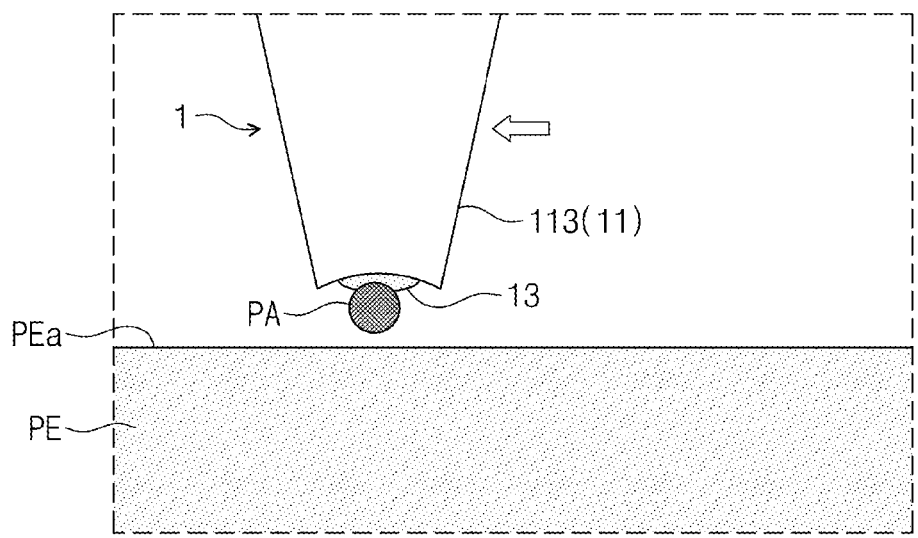

Referring to FIGS. 17 and 18, the particle bonding (i.e., operation S6') may include allowing the particle PA to bond to the adhesive material 13. For example, the particle PA may be adhered to the adhesive material 13 while the particle removal device 1 moves in a horizontal direction to pass over the top side of the particle PA. The adhesion between the particle PA and the adhesive material 13 may be achieved by an attractive force therebetween. For example, in a state where the particle PA and the adhesive material 13 are slightly spaced apart from each other, the mutual attractive force may cause that the particle PA is separated from the first surface PEa of the pellicle PE and bonded to the adhesive material 13. In another example, in a state where the adhesive material 13 and the particle PA horizontally overlap each other because a lower portion of the adhesive material 13 is located at a lower height than that of an upper portion of the particle PA, the adhesive material 13 may move in a horizontal direction to contact the particle PA and thus may be bonded to the particle PA.

According to a pellicle cleaning apparatus and a pellicle cleaning method using the same in accordance with some embodiments, particles may be removed while a particle removal device moves in a horizontal direction. For example, an adhesive material may not be required to downwardly press the particles, since the particles can be removed without being downwardly pressed (i.e., a force may be prevented from acting on a pellicle). Therefore, it may be possible to minimize damage to the pellicle. In addition, even when an exact position of the particles is not determined before the particles are removed, it may be possible to remove the particles.

Figure 19:
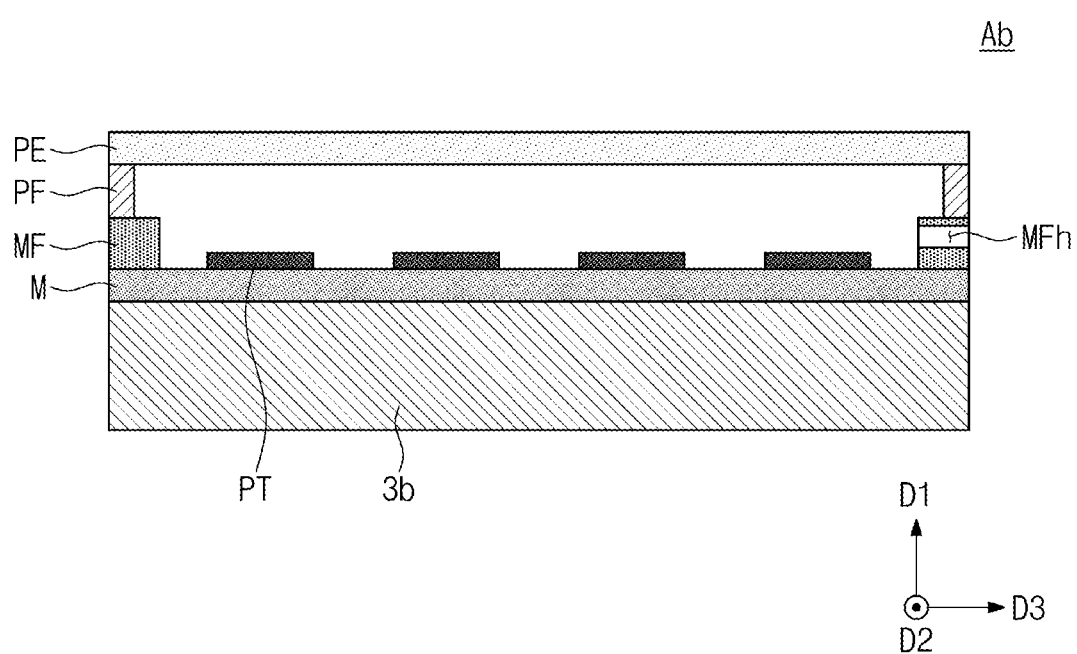
FIG. 19 illustrates a cross-sectional view showing a pellicle cleaning apparatus according to some embodiments.

FIG. 19 illustrates a cross-sectional view showing a pellicle cleaning apparatus according to some embodiments.

Referring to FIG. 19, a pellicle cleaning apparatus Ab may be provided. The pellicle cleaning apparatus Ab may include a stage 3b. The pellicle PE may be disposed on the stage 3b. The pellicle PE may be disposed on the stage 3b, while the pellicle PE is supported through the pellicle frame PF on a mask M. The mask M may be a photomask used in an exposure process. A fine pattern PT may be provided on the mask M. The pellicle PE may be coupled through a mask frame MF onto the mask M. The mask frame MF may provide a frame side hole MFh. The frame side hole MFh may be spatially connected to the pressure control device PC (FIG. 1). The pressure control device PC may control vibration of the pellicle PE through the frame side hole MFh. In this case, differently from that shown in FIG. 2, the stage 3b may not provide a pressure delivery hole.

According to a pellicle cleaning apparatus and a pellicle cleaning method using the same in accordance with some embodiments, a pellicle may undergo a cleaning process while the pellicle is coupled to a mask. In this case, the pellicle may not be required to be separated from the mask, and thus the cleaning process may be promptly performed. In addition, as a stage requires no pressure delivery hole, the stage may be simply configured.

Figure 20:
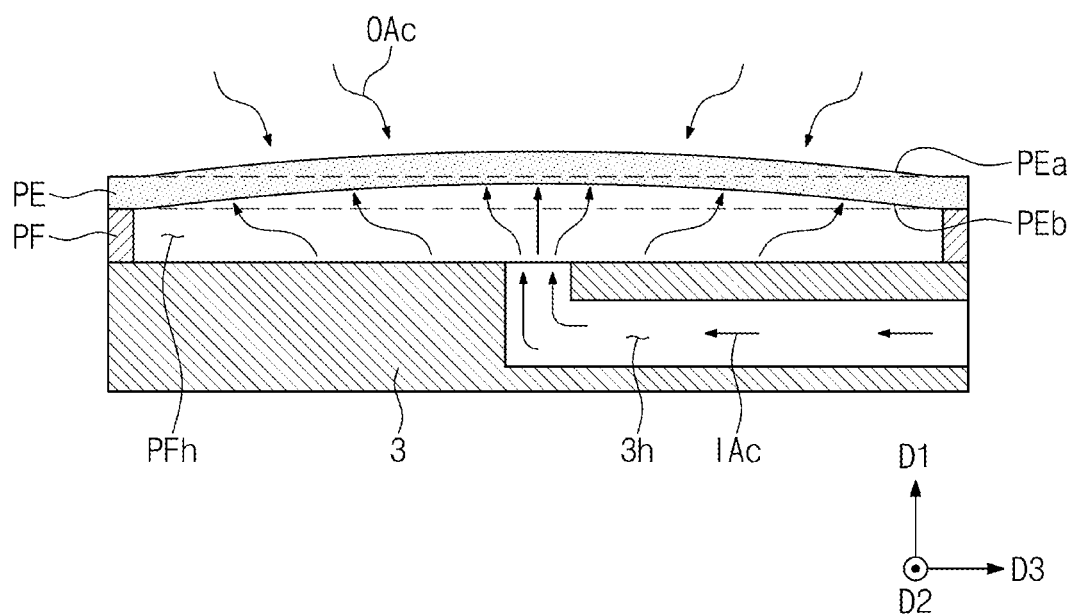
FIG. 20 illustrates a cross-sectional view partially showing a pellicle cleaning method according to some embodiments.

FIG. 20 illustrates a cross-sectional view partially showing a pellicle cleaning method according to some embodiments.

Referring to FIG. 20, vibration of the pellicle PE may be variously controlled. For example, the pellicle PE may be controlled to allow its first surface PEa to protrude convexly upwards. The pressure control device PC (FIG. 1) may be controlled to allow an inner air current IAc to become stronger than an outer air current OAc. As such, the pellicle PE may be controlled to protrude convexly upwards (e.g., due to the inner air current IAc being stronger than the outer air current OAc and creating a net force directed upward along the first direction D1). In this case, even when unexpected motion, e.g., turbulence, occurs in an outer air current, vibration of the pellicle PE may be suppressed.

Figure 21:
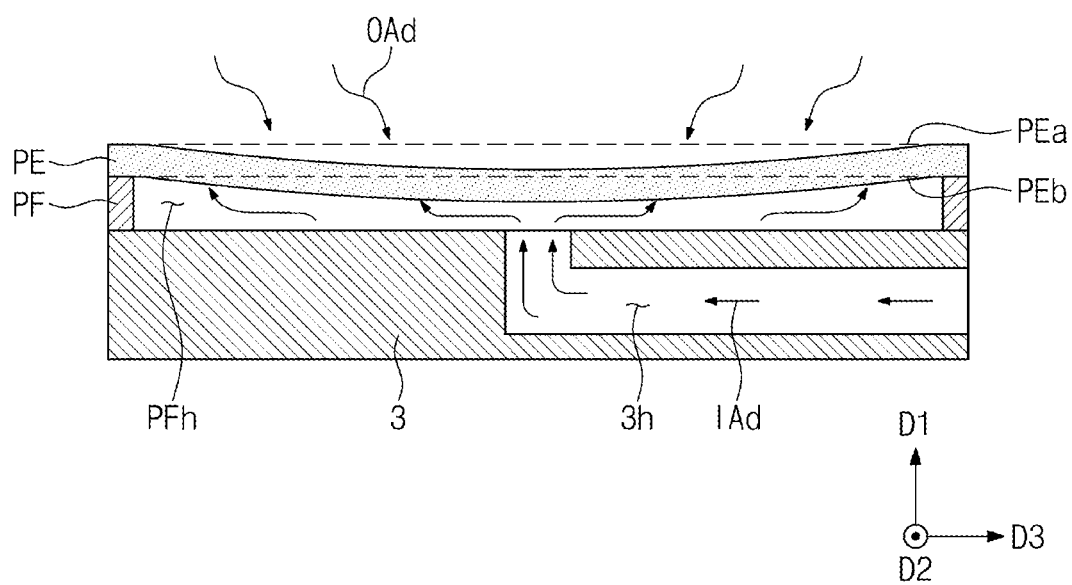
FIG. 21 illustrates a cross-sectional view partially showing a pellicle cleaning method according to some embodiments.

FIG. 21 illustrates a cross-sectional view partially showing a pellicle cleaning method according to some embodiments.

Referring to FIG. 21, vibration of the pellicle PE may be variously controlled. For example, the pellicle PE may be controlled to allow its first surface PEa to protrude concavely downwards (e.g., due to the inner air current IAc being weaker than the outer air current OAc and creating a net force directed downward along the first direction D1). The pressure control device PC (FIG. 1) may be controlled to allow the inner air current IAd to become weaker than the outer air current OAd.

Figure 22:
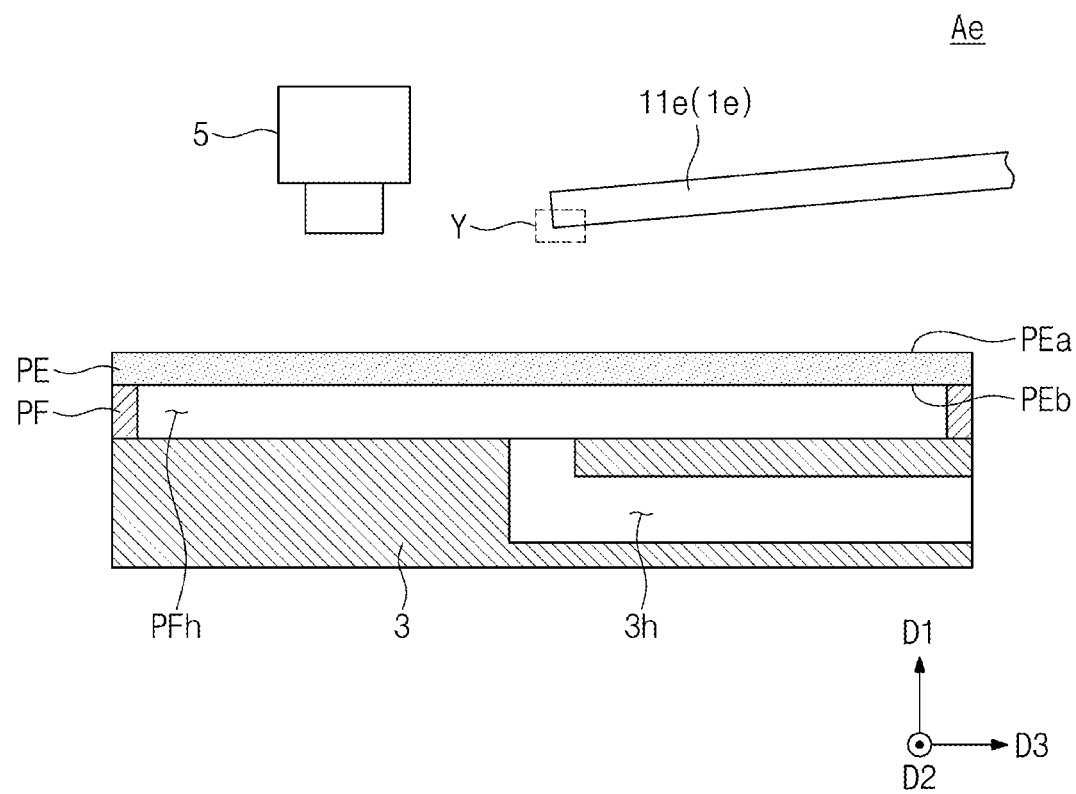
FIG. 22 illustrates a cross-sectional view showing a pellicle cleaning apparatus according to some embodiments.
Figure 23:
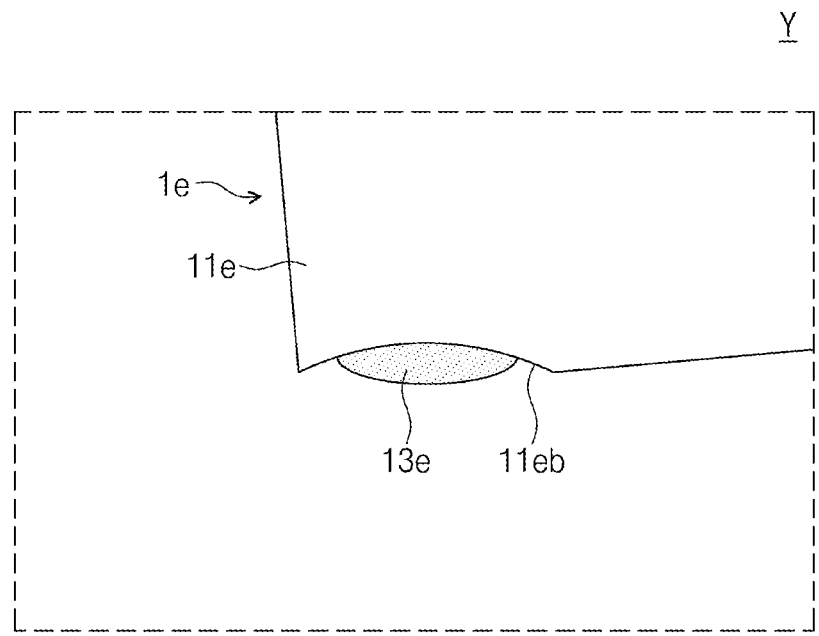
FIG. 23 illustrates an enlarged cross-sectional view of section Y of FIG. 22.

FIG. 22 illustrates a cross-sectional view showing a pellicle cleaning apparatus according to some embodiments. FIG. 23 illustrates an enlarged cross-sectional view showing section Y of FIG. 22.

Referring to FIGS. 22 and 23, a pellicle cleaning apparatus Ae may be provided. The pellicle cleaning apparatus Ae may include the stage 3, the capture device 5, and a particle removal device 1e. The particle removal device 1e may include a cantilever member 11e. For example, differently from the discussion with reference to FIG. 2, no tip may be provided on the cantilever member 11e. Therefore, the cantilever member 11e may be called a support member. An adhesive material 13e may be positioned on a bottom surface of the cantilever member 11e, e.g., the adhesive material 13e may be positioned directly on a bottom surface of the cantilever member 11e. An adhesive surface 11eb may be provided on the bottom surface of the cantilever member 11e, e.g., the adhesive surface 11eb may be provided on a bottom surface of the cantilever member 11e that faces the pellicle PE. In this case, the cantilever member 11e may be tilted to make a certain, e.g., oblique, angle with a horizontal direction, e.g., with the third direction D3.

According to a pellicle cleaning apparatus and a pellicle cleaning method using the same in accordance with some embodiments, an adhesive material may be bonded directly to a support member without a separate tip. Therefore, a particle removal device may have a simple configuration.

Figure 24:
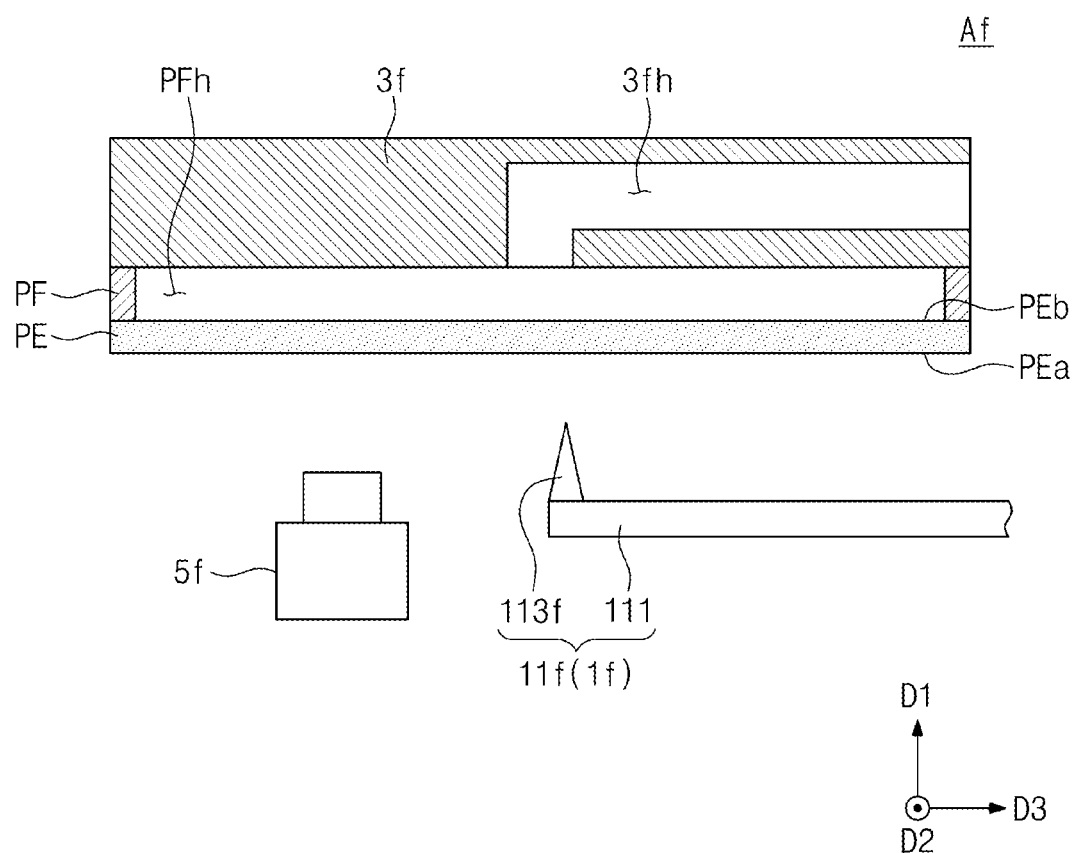
FIG. 24 illustrates a cross-sectional view of a pellicle cleaning apparatus according to some embodiments.

FIG. 24 illustrates a cross-sectional view showing a pellicle cleaning apparatus according to some embodiments.

Referring to FIG. 24, a pellicle cleaning apparatus Af may be provided. The pellicle cleaning apparatus Af may include a stage 3f, a particle removal device 1f, and a capture device 5f. Differently from that shown in FIG. 1, the pellicle PE coupled to the stage 3f may be directed downwardly. The particle removal device 1f and the capture device 5f may be positioned beneath the stage 3f. Beneath the stage 3f, the particle removal device 1f may remove particles on the first surface PEa of the pellicle PE.

According to a pellicle cleaning apparatus and a pellicle cleaning method using the same in accordance with some embodiments, a particle removal process may be performed in a state where particles on a pellicle are directed downwardly. Particles may be forced downwardly by gravity. Therefore, it may be easy for a particle removal device to perform the particle removal process. In addition, the pellicle may be prevented from being re-adhered with particles that are removed from the pellicle and dropped by gravity. In other words, the pellicle may be prevented from backward contamination.

According to a pellicle cleaning apparatus and a pellicle cleaning method using the same in accordance with embodiments, particles on a pellicle may be targeted and removed. According to a pellicle cleaning apparatus and a pellicle cleaning method using the same in accordance with embodiments, a pellicle may be cleaned without damage. According to a pellicle cleaning apparatus and a pellicle cleaning method using the same in accordance with embodiments, a pellicle may increase in lifetime.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pellicle cleaning apparatus, comprising:
   a stage to support a pellicle;
   a particle remover above the stage, the particle remover being configured to remove a particle from a first surface of the pellicle, and the particle remover including:
   a cantilever, and
   an adhesive material on a bottom surface of the cantilever; and
   a pressure controller adjacent to the stage, the pressure controller being arranged to supply air current to a second surface of the pellicle so as to control vibration of the pellicle, wherein
   the pellicle is controlled to spread flat when the air current supplied by the pressure controller to the second surface of the pellicle has a same strength as air current on the first surface of the pellicle,
   the pellicle is controlled to protrude convexly upwards when the air current supplied by the pressure controller to the second surface of the pellicle is stronger than the air current on the first surface of the pellicle, or
   the pellicle is controlled to protrude concavely downwards when the air current supplied by the pressure controller to the second surface of the pellicle is weaker than the air current on the first surface of the pellicle.

2. The pellicle cleaning apparatus as claimed in claim 1, further comprising a pellicle frame on the stage, the pellicle frame including a frame space exposing a center of the stage.

3. The pellicle cleaning apparatus as claimed in claim 2, wherein:
   the stage includes a pressure delivery hole connected to the frame space,
   the second surface of the pellicle is exposed to the frame space, and
   the pressure controller is connected to the pressure delivery hole.

4. The pellicle cleaning apparatus as claimed in claim 1, wherein the cantilever includes:
   a support member; and
   a tip extending from the support member toward the stage, the adhesive material being on a bottom surface of the tip.

5. A pellicle cleaning method, comprising:
   supplying air current to a second surface of a pellicle so as to control vibration of the pellicle, wherein
   the pellicle spreads flat when the air current supplied to the second surface of the pellicle has a same strength as air current on a first surface of the pellicle,
   the pellicle protrudes convexly upwards when the air current supplied to the second surface of the pellicle is stronger than the air current on the first surface of the pellicle, or
   the pellicle protrudes concavely downwards when the air current supplied to the second surface of the pellicle is weaker than the air current on the first surface of the pellicle;
   obtaining an information about a position of a particle on the first surface of the pellicle;
   placing a particle remover above the particle;
   driving the particle remover toward the particle and the first surface of the pellicle;
   adhering the particle to the particle remover by allowing the particle to adhere to an adhesive material on the particle remover; and
   removing the particle remover with the adhered particle.

6. The pellicle cleaning method as claimed in claim 5, wherein adhering the particle to the particle remover includes moving the particle remover toward the first surface of the pellicle, such that the adhesive material is pressed against the particle.

7. The pellicle cleaning method as claimed in claim 6, further comprising ascertaining whether the adhesive material is pressed against the particle.

8. The pellicle cleaning method as claimed in claim 5, wherein obtaining the information about the position of the particle on the first surface of the pellicle includes:
   using an imager to capture an image of the first surface of the pellicle to obtain an image information about the first surface of the pellicle; and
   obtaining the information of the position of the particle from the image information.

9. The pellicle cleaning method as claimed in claim 5, further comprising ascertaining whether the particle is removed from the pellicle.

10. A pellicle cleaning method, comprising:
    loading a pellicle on a stage;
    supplying air current to a second surface of the pellicle so as to control vibration of the pellicle;
    placing a particle remover above the pellicle;
    driving the particle remover to move above the pellicle;

adhering a particle from a first surface of the pellicle to the particle remover by allowing the particle to adhere to an adhesive material on the particle remover; and removing the particle remover with the adhered particle from the pellicle, wherein supplying the air current to the second surface of the pellicle is maintained during placing the particle remover, driving the particle remover, adhering the particle, and removing the particle remover.

11. The pellicle cleaning method as claimed in claim 10, wherein driving the particle remover includes moving the particle remover in a horizontal direction above the pellicle.

12. The pellicle cleaning method as claimed in claim 11, wherein allowing the particle to adhere to the adhesive material of the particle remover includes allowing the particle to adhere to the adhesive material on the particle remover during movement in the horizontal direction.

13. The pellicle cleaning method as claimed in claim 10, wherein loading the pellicle on the stage includes placing a pellicle frame on the stage, the pellicle frame supporting the pellicle.

14. The pellicle cleaning method as claimed in claim 10, further comprising analyzing a component of the particle.

* * * * *